United States Patent
Cho et al.

(10) Patent No.: US 8,203,163 B2
(45) Date of Patent: Jun. 19, 2012

(54) LIGHTING EMITTING DEVICE PACKAGE AND METHOD OF FABRICATING THE SAME INCLUDING A PLATING LAYER AT AN OUTER CIRCUMFERENCE OF THE PACKAGE BODY

(75) Inventors: Bum Chul Cho, Jeonju-si (KR); Geun Ho Kim, Seoul (KR); Sung Jin Son, Gwangju (KR); Jin Soo Park, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 12/676,850

(22) PCT Filed: Sep. 5, 2008

(86) PCT No.: PCT/KR2008/005264
§ 371 (c)(1),
(2), (4) Date: Sep. 21, 2010

(87) PCT Pub. No.: WO2008/005264
PCT Pub. Date: Mar. 12, 2009

(65) Prior Publication Data
US 2011/0309391 A1    Dec. 22, 2011

(30) Foreign Application Priority Data
Sep. 6, 2007  (KR) .................. 10-2007-0090321

(51) Int. Cl.
*H01L 33/00* (2010.01)
*H01L 29/00* (2006.01)
*H01L 31/0288* (2006.01)
*H01L 31/112* (2006.01)

(52) U.S. Cl. ................ 257/98; 257/257; 257/678
(58) Field of Classification Search ............ 257/98, 257/257, 678
See application file for complete search history.

(56) References Cited

U.S. PATENT DOCUMENTS

| | | | |
|---|---|---|---|
| 6,706,546 B2 * | 3/2004 | Inao et al. ............ | 438/31 |
| 2006/0001055 A1 * | 1/2006 | Ueno et al. ............ | 257/257 |
| 2006/0018120 A1 * | 1/2006 | Linehan et al. ....... | 362/247 |
| 2006/0147746 A1 * | 7/2006 | Wakako et al. ....... | 428/627 |
| 2007/0200131 A1 | 8/2007 | Kim | |

FOREIGN PATENT DOCUMENTS

| | | |
|---|---|---|
| JP | 02-296064 A | 12/1990 |
| JP | 05-102531 A | 4/1993 |
| JP | 2003-031914 A | 1/2003 |
| JP | 2004-207258 A | 7/2004 |
| JP | 2007-12822 A | 1/2007 |
| JP | 2007-134602 A | 5/2007 |
| KR | 10-2007-0001512 A | 1/2007 |

* cited by examiner

*Primary Examiner* — William M. Brewster
(74) *Attorney, Agent, or Firm* — Birch, Stewart, Kolasch & Birch, LLP

(57) ABSTRACT

Provided is a light emitting device package and a method of fabricating the same. The light emitting device package comprises a package body having a cavity, a seed layer on a surface of the package body, a conductive layer on the seed layer, a mirror layer on the conductive layer, and a light emitting device in the cavity.

16 Claims, 3 Drawing Sheets

[Fig. 1]
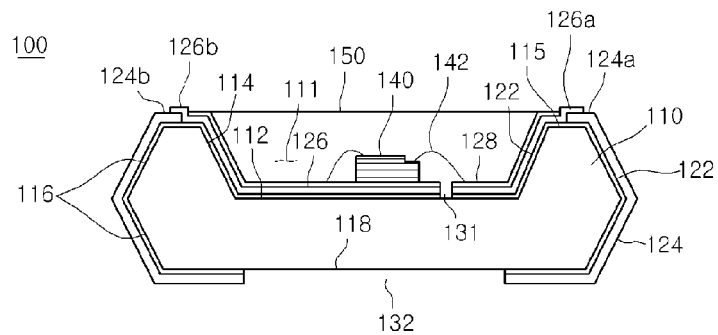
[Fig. 2]
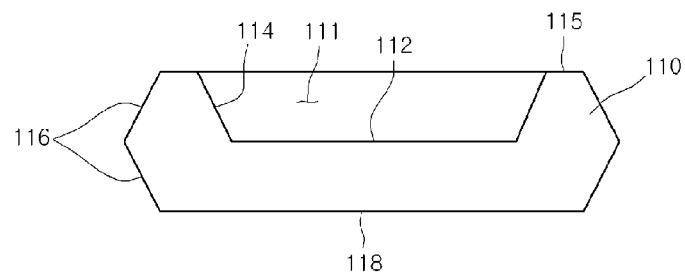
[Fig. 3]
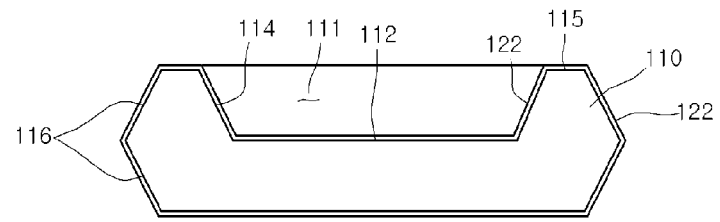
[Fig. 4]
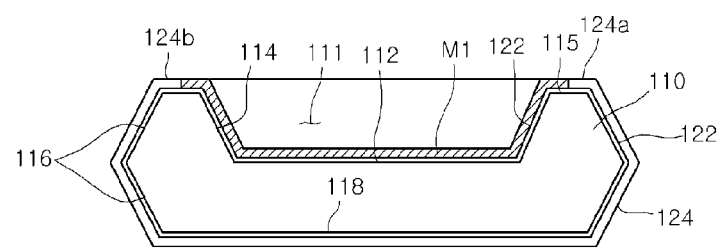
[Fig. 5]
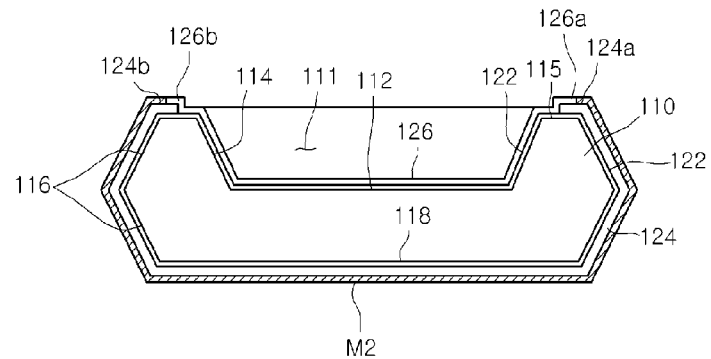

[Fig. 6]
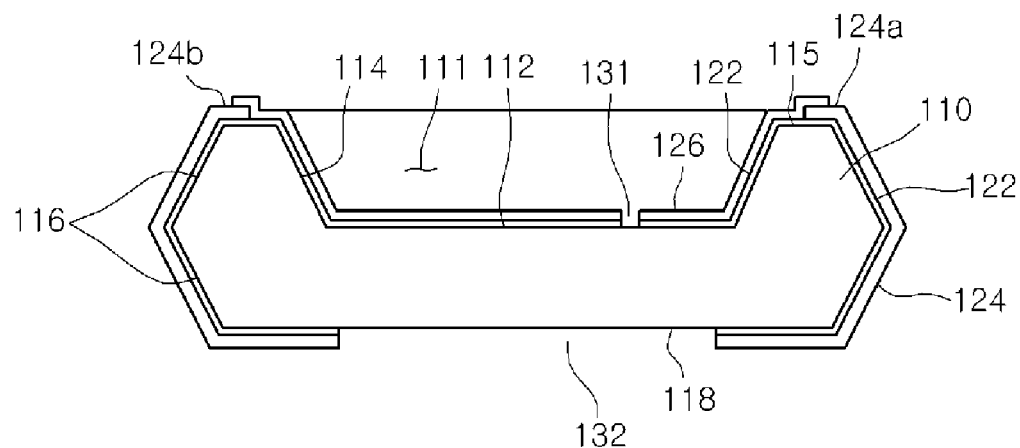
[Fig. 7]
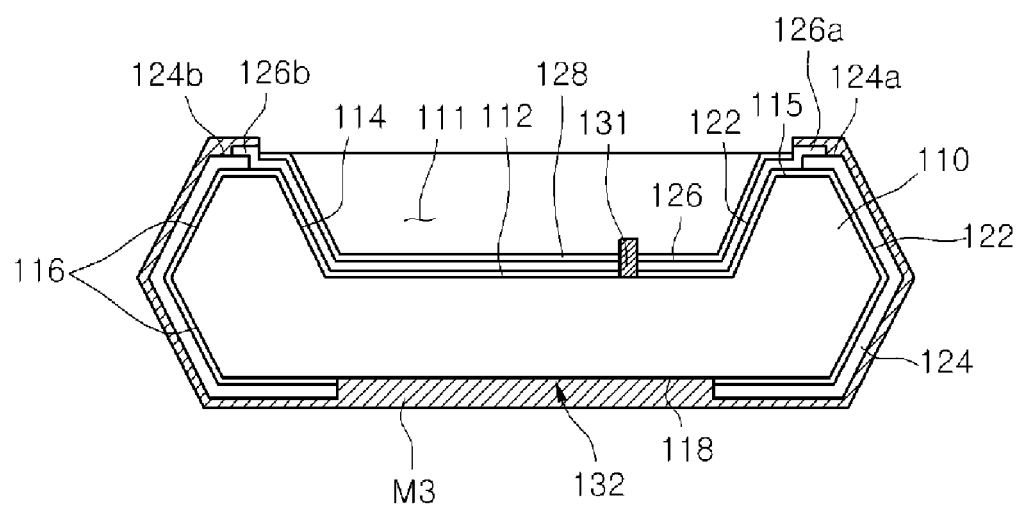
[Fig. 8]
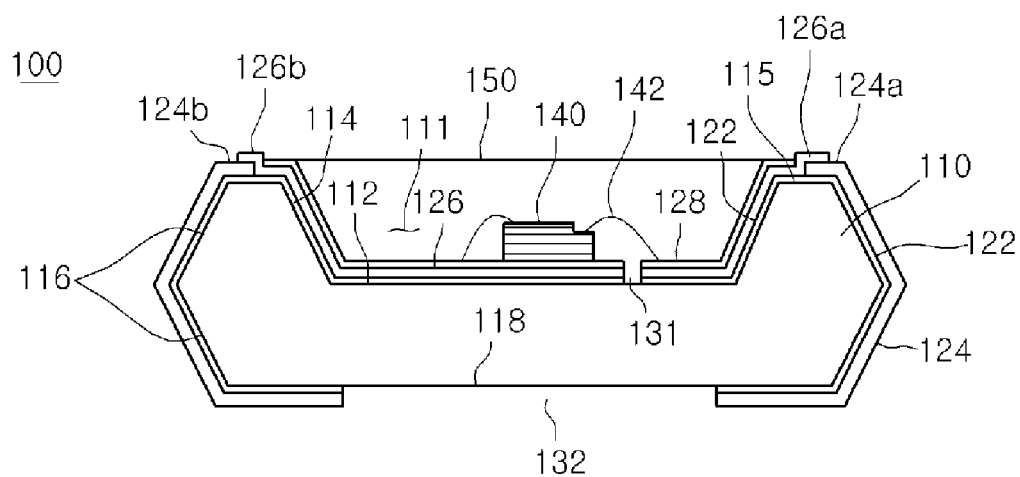

[Fig. 9]
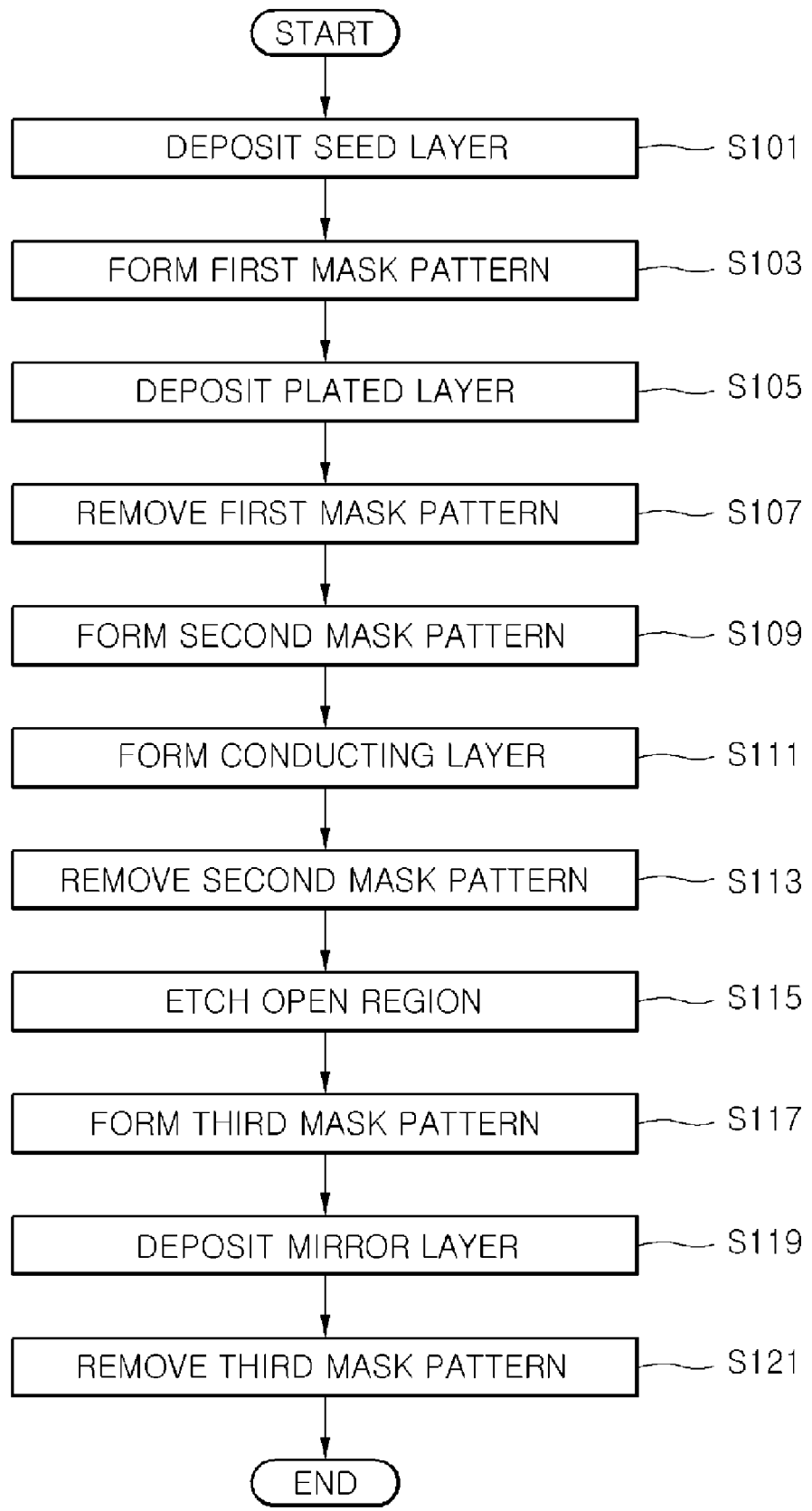

LIGHTING EMITTING DEVICE PACKAGE AND METHOD OF FABRICATING THE SAME INCLUDING A PLATING LAYER AT AN OUTER CIRCUMFERENCE OF THE PACKAGE BODY

This application claims priority under 35 U.S.C. 119 to Korean Patent Application No. 10-2007-0090321, filed on Sep. 6, 2007, and under 35 U.S.C. 365 to PCT application No. PCT/KR2008/005264, filed on Sep. 5, 2008, which are hereby incorporated by references in their entirety.

TECHNICAL FIELD

Embodiments relate to a light emitting device package and a method of fabricating the same.

BACKGROUND ART

A light emitting diode (LED) constitutes a light emitting source using GaAs series, AlGaAs series, GaN series, InGaN series, or InGaAlP series compound semiconductor materials.

This LED is packaged and used as a light emitting device for emitting various colors, and the light emitting device is used as a light source in various fields such as an on/off display for displaying colors, an alphanumeric display, and an image display.

DISCLOSURE OF INVENTION

Technical Problem

Embodiments provide a light emitting device package capable of improving the soldering characteristic and light intensity of a package and a method of fabricating the same.

Embodiments also provide a light emitting device package capable of preventing resin material from overflowing toward the outside through an upper projection of a package body such that work yield deterioration due to the resin material can be avoided, and a method of fabricating the same.

Technical Solution

An embodiment provides a light emitting device package comprising: a package body comprising a cavity; a seed layer on a surface of the package body; a conductive layer on the seed layer; a mirror layer on the conductive layer; and a light emitting device in the cavity.

An embodiment, a method of fabricating a light emitting device package comprising: forming a cavity with a predetermined depth in a package body; forming a seed layer on a surface of the package body; forming a plated layer on the seed layer at an outer circumference of the package body; forming a conductive layer on the seed layer in the cavity of the package body; electrically separating the seed layer, the plated layer, and the conductive layer by partially etching them; forming a minor layer on the conductive layer; and mounting a light emitting device in the cavity.

Advantageous Effects

Embodiments improve the soldering characteristic of a package.

Embodiments prevent resin material from overflowing through an upper projection of a package body and also prevent work yield deterioration due to resin material during soldering.

Embodiments improve the light intensity of a package.

BRIEF DESCRIPTION OF THE DRAWINGS

FIG. 1 is a cross-sectional view of a light emitting device package according to an embodiment.

FIGS. 2 to 8 are views illustrating a method of fabricating a light emitting device package according to an embodiment.

FIG. 9 is a flowchart illustrating a process of forming a metal layer on a package body according to an embodiment.

BEST MODE FOR CARRYING OUT THE INVENTION

Hereinafter, embodiments will be described with reference to the accompanying drawings. In description of the embodiments, the thickness of each layer is merely one example and is not limited to that in the accompanying drawings.

FIG. 1 is a cross-sectional view of a light emitting device package according to an embodiment.

Referring to FIG. 1, a light emitting device package 100 is a silicon-based wafer level package (WLP) and uses a polyhedral (e.g., rectangular parallelepiped) package frame 110.

A cavity 111 is formed in the top of the package body 110. The cavity 111 may be realized with any one of a tube with an inner space, a polygonal groove, and a circular groove.

An inner side 114 of the cavity 111 is formed slanted at a predetermined angle or with a predetermined curvature.

A top 115 of the package body 110 is formed on the outside of the cavity 111, and a body side 116 is curved at a predetermined angle to be slanted toward the top and bottom directions but is not limited thereto.

Additionally, at least one body side 116 of the package body 110 is formed slanted toward the top and bottom directions, and the other body side (not shown) may be perpendicularly formed.

A seed layer 122 is formed on an entire surface of the package body 110 except for open regions 131 and 132. The seed layer 122 comprises a sequentially-stacked Ti layer/Cu layer or a sequentially-stacked Ti layer/Cu layer/Ti layer. The seed layer 122 improves adhesiveness with respect to the package body 110, and also between other metal layers (e.g., comprising a conductive layer and a plated layer). The seed layer 122 may be formed with a thickness of 1000 Å to 7000 Å.

A plated layer 124 is formed on the seed layer 122 at the outer circumference of the package body 110. The outer circumference of the package body 110 comprises the outers of a portion of the rear 118, the side 116, and the top 115 of the package body 110.

The plated layer 124 is formed with a thick layer through a plating method (e.g., an electrolytic or electroless plating method), such that soldering characteristic during a surface mount technology (SMT) process can be improved. The plated layer 124 is formed with a thickness of 1.5 μm to 2.0 μm, for example.

The plated layer 124 can be formed with a multilayer comprising Cu, Ni, Au, and Ti on the seed layer 122 and, for example, comprises a sequentially-stacked Cu layer/Ni layer/Au layer or a sequentially-stacked Ti layer/Cu layer/Ni layer/Au layer.

Here, end portions 124a and 124b of the plated layer 124 are formed extending to the top 115 of the package body 110.

The conductive layer 126 is formed on the seed layer 122 at the cavity 111 of the package body 110. The conductive layer 126 is formed extending to a bottom 112, the inner side 114, and the body top 115 of the cavity 111. The conductive layer 126 is formed with a multilayer comprising Cu, Ni, Au, and Ti and, for example, comprises a sequentially-stacked Cu layer/Ni layer/Au layer or a sequentially-stacked Ti layer/Cu layer/Ni layer/Au layer.

Here, end portions 126a and 126b of the conductive layer 126 extends on the end portions 124a and 124b at the body top 115 and protrudes with a projection form. The end portions 126a and 126b of the conductive layer 126 prevents resin material 150 molded in the cavity 111 from overflowing, and also foreign materials from inflowing through the body side 116. Because the resin material 150 is prevented from overflowing toward the outside of the package body 110, work yield deterioration due to the resin material 150 can be avoided during the soldering of the light emitting device package 100.

The conductive layer 126 is formed thicker than other layers, for example, with a thickness of 1000 Å to 7000 Å. The conductive layer 126 can improve electrical characteristic.

A mirror layer 128 is formed on the conductive layer 126. The mirror layer 128 selectively comprises a sequentially-stacked Ti layer/Ag layer, a sequentially-stacked Ti layer/Al layer, an alloy of Ti and Ag, and an alloy of Ti and Al, on the conductive layer 126. The minor layer 128 is formed with a thickness of 1000 Å to 4000 Å, for example. Additionally, because the minor layer 128 is formed on the conductive layer 126, metal materials can be prevented from peeling off.

The minor layer 128 improves a reflected amount of the light generated from a light emitting device 140 such that the light intensity of the light emitting device package 100 can be improved.

The seed layer 122, the conductive layer 126, and the minor layer 128 of the package body 110 may be deposited using an electron beam deposition method or/and a sputtering method.

At least one light emitting device 140 is mounted in the cavity 111 of the package body 110, and the light emitting device 140 may comprise colored LED chips such as a blue LED chip, a green LED chip, and a red LED chip, or a UV LED chip. The light emitting device 140 is mounted on an electrode terminal of the cavity 111.

The minor layer 128 and the conductive layer 126 formed on the bottom 112 of the cavity 111 may be used as an electrode terminal. The electrode terminal in the cavity 111 is electrically connected to a portion of the rear 118 along the side 116 of the package body 110. The first open region 131 is formed in the cavity 111 and the first open region 131 divides the seed layer 122, the conductive layer 126, and the minor layer 128 into a plurality of areas. The second open region 132 is formed at the rear 118 of the package body 110, and the second open region 132 divides the seed layer 122 and the plated layer 124 into a plurality of regions. That is, the first and second open regions 131 and 132 divide the electrode terminal into a plurality of electrode terminals.

Here, the light emitting device 140 can be connected to the electrode terminal through a wire 142 or a flip chip method, but is not limited thereto. An arrangement structure of the electrode terminal may vary based on the number of LED chips and a design method, but is not limited thereto.

The resin material 150 of a transparent resin material is molded in the cavity 111 and protects the light emitting device 140. The resin material 150 is formed of transparent epoxy or silicon material and at least one of red, green blue fluorescent substances may be added to the resin material 150, but is not limited thereto.

FIGS. 2 to 8 are views illustrating a method of fabricating a light emitting device package according to an embodiment. FIG. 9 is a flowchart illustrating a process of forming a metal layer on a package body according to an embodiment.

Referring to FIGS. 2 and 3, the cavity 111 is formed with a predetermined depth in the top of the package body 110. The cavity 111 may be formed with a predetermined depth by etching the middle top of the package body 110. Here, the package body 110 is a silicon wafer.

The seed layer 122 is deposited on the entire surfaces 112, 114, 116, and 118 of the package body 110 in operation S101 of FIG. 9. The seed layer 122 improves adhesiveness with respect to the package body 110, and also between other metal layers. The seed layer 122 may be formed with a thickness of 1000 Å to 7000 Å, for example.

Referring to FIGS. 3 and 4, a first mask pattern M1 is formed on the seed layer 122 on top of the package body 110 in operation S103 of FIG. 9. Here, the first mask pattern M1 is formed on the bottom 112 and the inner side 114 of the cavity 111 and a portion of the body top 115 through a photo-lithography method.

In operation S105 of FIG. 9, the plated layer 124 is deposited on the seed layer 122 at the outer circumference of the package body 110, i.e., an area except for the first mask pattern M1.

The plated layer 124 may be formed with a multilayer comprising Cu, Ni, Au, and Ti on the seed layer 122, and, for example, comprises a sequentially-stacked Cu layer/Ni layer/Au layer or a sequentially-stacked Ti layer/Cu layer/Ni layer/Au layer. The plated layer 124 is formed with a thickness of 1.5 μm to 2.0 μm, for example. If the upper most layer of the seed layer 122 is a Ti layer, a Cu layer of the plated layer 124 may be formed after etching it. The plated layer 124 is formed with a thick layer through a plating method such that soldering characteristic can be improved during a SMT process.

Referring to FIGS. 4 and 5, the first mask pattern M1 is removed in operation S107 of FIG. 9 and a second mask pattern M2 is formed in operation S109 of FIG. 9. The second mask pattern M2 is formed at the outer circumference of the package body 110, i.e., the outers of the body top 115, the body side 116, and the rear 118, through a photo-lithography method.

The conductive layer 126 is formed on the seed layer 122 in an area except for the second mask pattern M2 in operation S111 of FIG. 9. The conductive layer 126 extends from the inner circumference of the cavity 111 to the body top 115. Here, the end portions 126a and 126b of the conductive layer 126 on the body top 115 are formed on the end portions 124a and 124b of the plated layer 124.

The conductive layer 126 comprises a sequentially-stacked Cu layer/Ni layer/Au layer or a sequentially-stacked Ti layer/Cu layer/Ni layer/Au layer, on the seed layer 122. The conductive layer 126 is formed with a thickness of 1000 Å to 7000 Å, and the Ni layer or the Au layer may be formed with a thickness of 100 Å to 3000 Å. The Au layer prevents the conductive layer 126 from being damaged by an impact or friction.

Because the conductive layer 126 is formed with a multi-metal layer, it can improve electrical characteristics. Moreover, since the end portions 126a and 126b of the conductive layer 126 protrude with a projection form on the body top 115, the resin material 150 filled in the cavity 111 can be prevented from overflowing. The resin material 150 may be molded into the cavity 111 through a dispensing process after mounting a light emitting device.

Referring to FIGS. 5 and 6, the second mask pattern M2 is removed in operation S113 of FIG. 9, and then the first open region 131 is formed by etching the inner circumference of the cavity 111 and the second open region 132 is formed by etching the body rear 118 in operation S115 of FIG. 9. Because the first and second open regions 131 and 132 are etched up to the seed layer 122, at least two electrode terminals are disposed with an open structure on the both sides of the cavity 111.

Referring to FIG. 7, when the first and second open regions 131 and 132 are formed, a third mask pattern M3 can be formed on the outer circumference of the package body 110 in operation S117 of FIG. 9. The third mask pattern M3 can be formed through a photo-lithography method. The third mask pattern M3 is formed on a upper portion of the plated layer 124, the end portions 126a and 126b of the conductive layer 126. Also, The third mask pattern M3 can be formed in a part among the end portions 126a and 126b of the conductive layer 126, on the plated layer 124, the first open region 131 of the cavity bottom 112, and the second open region 132 of the body rear 118 at least.

The minor layer 128 is formed on the conductive layer 126 where no third mask pattern M3 is formed in operation S119 of FIG. 9. The mirror 128 comprises a sequentially-stacked Ti layer/Ag layer, a sequentially stacked Ti layer/Al layer, or an alloy of Ti and Al, on the conductive layer 126. The mirror layer 128 is formed with a thickness of 1000 Å to 4000 Å. Here, because the mirror layer 128 is formed on the conductive layer 126, a luminous efficiency of LED chip can increase.

Moreover, an end portion of the mirror layer 128 can be formed on an end portion of the conductive layer 126 but is not limited thereto. A process for forming the mirror layer 128 can be performed before forming the first and second open regions 131 and 132.

Referring to FIGS. 7 and 8, the third mask pattern M3 is removed in operation 5121 of FIG. 9. Moreover, the light emitting device 140 is attached to the minor layer 128 through an adhesive and then is electrically connected to the minor layer 128 and the conductive layer 126 through the wire 142. Here, the light emitting device 140 may be connected through a flip method or a die attachment method. The light emitting device 140 may comprise colored LED chips such as a blue LED chip, a green LED chip, and a red LED chip, or a UV LED chip.

The resin material 150 that light transmits or the resin material 150 to which at least one kind of a fluorescent substance is added is molded in the cavity 111. Additionally, a convex lens can be attached on the resin material 150.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

Embodiments are used as a light emitting device package comprising an LED.

Embodiments are used as a light emitting device package of a silicon wafer.

Embodiments are used as a light source in various fields such as an on/off display, an alphanumeric display, and an image display by the use of a wafer level package (WLP).

The invention claimed is:

1. A light emitting diode package comprising:
a package body having a cavity;
a seed layer on a surface of the package body;
a plating layer on the seed layer at an outer circumference of the package body;
a conductive layer on an inner peripheral surface of the cavity; and
a mirror layer on the conductive layer,
wherein an end portion of the conductive layer extends on a top of the package body and is formed with a projection on the plating layer.

2. The light emitting diode package as claimed in claim 1, wherein the cavity has a circular shape or a polygonal shape.

3. The light emitting diode package as claimed in claim 1, wherein the plating layer is formed on a top surface, a lateral surface and a part of a lower surface of the package body.

4. The light emitting diode package as claimed in claim 3, wherein both ends of the conductive layer extend onto the plating layer formed on the top surface of the package body.

5. The light emitting diode package as claimed in claim 1, wherein both ends of the conductive layer protrude of a jaw shape on a top surface of the package body.

6. The light emitting diode package as claimed in claim 3, wherein the seed layer, the conductive layer and the plating layer, which are formed on a bottom surface of the cavity and the lower surface of the package body, are electrically open.

7. The light emitting diode package as claimed in claim 1, wherein the seed layer is formed on the package body and includes at least one of a titanium layer and a copper layer.

8. The light emitting diode package as claimed in claim 1, wherein the conductive layer is formed on the seed layer and comprises at least one selected from the group of a titanium layer, a copper layer, a nickel layer and a gold layer.

9. The light emitting diode package as claimed in claim 1, wherein the mirror layer is formed on the conductive layer and comprises at least one selected from the group of titanium, silver, aluminum and an alloy thereof.

10. The light emitting diode package as claimed in claim 1, wherein at least one of the seed layer and the conductive layer has at thickness of about 1000 Å to 7000 Å.

11. The light emitting diode package as claimed in claim 1, wherein the mirror layer has at thickness of about 1000 Å to 4000 Å.

12. The light emitting diode package as claimed in claim 3, wherein the plating layer is formed on the seed layer and comprises at least one selected from the group of a titanium layer, a copper layer, a nickel layer and a gold layer.

13. The light emitting diode package as claimed in claim 2, wherein the plating layer has a thickness of about 1.5 µm to 2.0 µm.

14. The light emitting diode package as claimed in claim 1, further comprising at least one light emitting diode chip mounted on the cavity,
wherein the light emitting diode chip is electrically connected to the mirror layer.

15. The light emitting diode package as claimed in claim 1, wherein a mold member or a mold member including a phosphor is molded in the cavity.

16. The light emitting diode package as claimed in claim 1, wherein the package body is formed of a silicon wafer.

* * * * *